United States Patent
Garnier

(10) Patent No.: US 8,093,686 B2
(45) Date of Patent: Jan. 10, 2012

(54) PROCESS FOR OBTAINING A HYBRID SUBSTRATE COMPRISING AT LEAST ONE LAYER OF A NITRIDED MATERIAL

(75) Inventor: Arnaud Garnier, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 200 days.

(21) Appl. No.: 12/672,819

(22) PCT Filed: Sep. 1, 2008

(86) PCT No.: PCT/EP2008/061488
§ 371 (c)(1),
(2), (4) Date: Feb. 9, 2010

(87) PCT Pub. No.: WO2009/030662
PCT Pub. Date: Mar. 12, 2009

(65) Prior Publication Data
US 2011/0095400 A1    Apr. 28, 2011

(30) Foreign Application Priority Data

Sep. 4, 2007 (FR) ..................................... 07 06180

(51) Int. Cl.
*H01L 29/20* (2006.01)
(52) U.S. Cl. ........................................ 257/615; 257/347
(58) Field of Classification Search .................... 257/615
See application file for complete search history.

(56) References Cited

U.S. PATENT DOCUMENTS

| | | | |
|---|---|---|---|
| 2003/0077885 A1 | 4/2003 | Aspar et al. | 438/517 |
| 2004/0014299 A1 * | 1/2004 | Moriceau et al. | 438/459 |
| 2004/0262686 A1 * | 12/2004 | Shaheen et al. | 257/347 |
| 2005/0066886 A1 * | 3/2005 | Akatsu et al. | 117/84 |
| 2006/0021565 A1 * | 2/2006 | Zahler et al. | 117/89 |

(Continued)

FOREIGN PATENT DOCUMENTS

EP    1 429 381    6/2004
(Continued)

OTHER PUBLICATIONS

International Search Report, PCT/EP2008/061488, mailed Apr. 22, 2009.

(Continued)

*Primary Examiner* — N Drew Richards
*Assistant Examiner* — Ankush Singal
(74) *Attorney, Agent, or Firm* — Winston & Strawn LLP

(57) ABSTRACT

A process for obtaining a hybrid substrate that includes at least one active layer of Group III/N material for applications in the field of electronics, optics, photovoltaics or optoelectronics. The method includes selecting a source substrate of Group III/N material having a hexagonal single crystal crystallographic structure; carrying out an implantation of $He^+$ helium ions into the source substrate through an implantation face which lies in a plane approximately parallel with the "c" crystallographic axis of the material, at an implantation dose equal to or greater than $1\times10^{16}$ $He^+/cm^2$ and $1\times10^{17}$ $He^+/cm^2$, to form therein a number of nanocavities defining a weakened zone which delimits the active layer; and transferring the active layer by applying an overall energy budget capable of causing detachment of the layer from the source substrate, wherein the budget also causes the nanocavities to grow into cavities.

19 Claims, 2 Drawing Sheets

U.S. PATENT DOCUMENTS

| | | | |
|---|---|---|---|
| 2006/0185582 A1* | 8/2006 | Atwater et al. | 117/89 |
| 2006/0255341 A1* | 11/2006 | Pinnington et al. | 257/79 |
| 2007/0072324 A1* | 3/2007 | Krames et al. | 438/46 |
| 2007/0173033 A1 | 7/2007 | Allibert et al. | 438/455 |
| 2008/0171133 A1* | 7/2008 | Richter et al. | 427/58 |

FOREIGN PATENT DOCUMENTS

| | | |
|---|---|---|
| EP | 1 811 560 | 7/2007 |
| WO | WO 01/93325 | 12/2001 |

OTHER PUBLICATIONS

Alquier, D. et al., "Interaction Between Dislocations and He-Implantation-Induced Voids in GaN Epitaxial Layers", Applied Physics Letters, vol. 86, pp. 211911-1-211911-3 (2005).

Haskell, B.A. et al. "Structural and Morphological Characteristics of Planar (1120) A-Plane Gallium Nitride Grown by Hydride Vapor Phase Epitaxy", Applied Physics Letters, vol. 83, No. 8, pp. 1554-1556 (2003).

Ko, T.S. et al., "Study on Optimal Growth of $a$-Plane GaN Grown on $r$-Plane Sapphire by Metal-Organic Chemical Vapor Deposition", Journal of Crystal Growth, vol. 300, pp. 308-313 (2007).

Kucheyev, S.O. et al., "Blistering of H-Implanted GaN", Journal of Applied Physics, vol. 91, No. 6, pp. 3928-3930 (2002).

Radu, I. et al., "Formation of Nanovoids in High-Dose Hydrogen Implanted GaN", Applied Physics Letters, vol. 89, p. 031912-1-031912-2 (2006).

Seager, C.H. et al., "Infrared and Transmission Electron Microscopy Studies of Ion-Implanted H in GaN", Journal of Applied Physics, vol. 85, No. 5, pp. 2568-2573 (1999).

Singh, R. et al. "Investigation of Hydrogen Implantation Induced Blistering in GaN", Phys. Stat. Sol., vol. 3, No. 6, pp. 1754-1757 (2006).

Tauzin, A. et al., "Transfer of 2-Inch GaN Films onto Sapphire Substrates using Smart-Cut™ Technology", Electronics Letters, vol. 41, No. 11 (2005).

Tauzin, A. et al., "Transfer of Two-Inch GaN Film by the Smart-Cut™ Technology" (2005).

\* cited by examiner

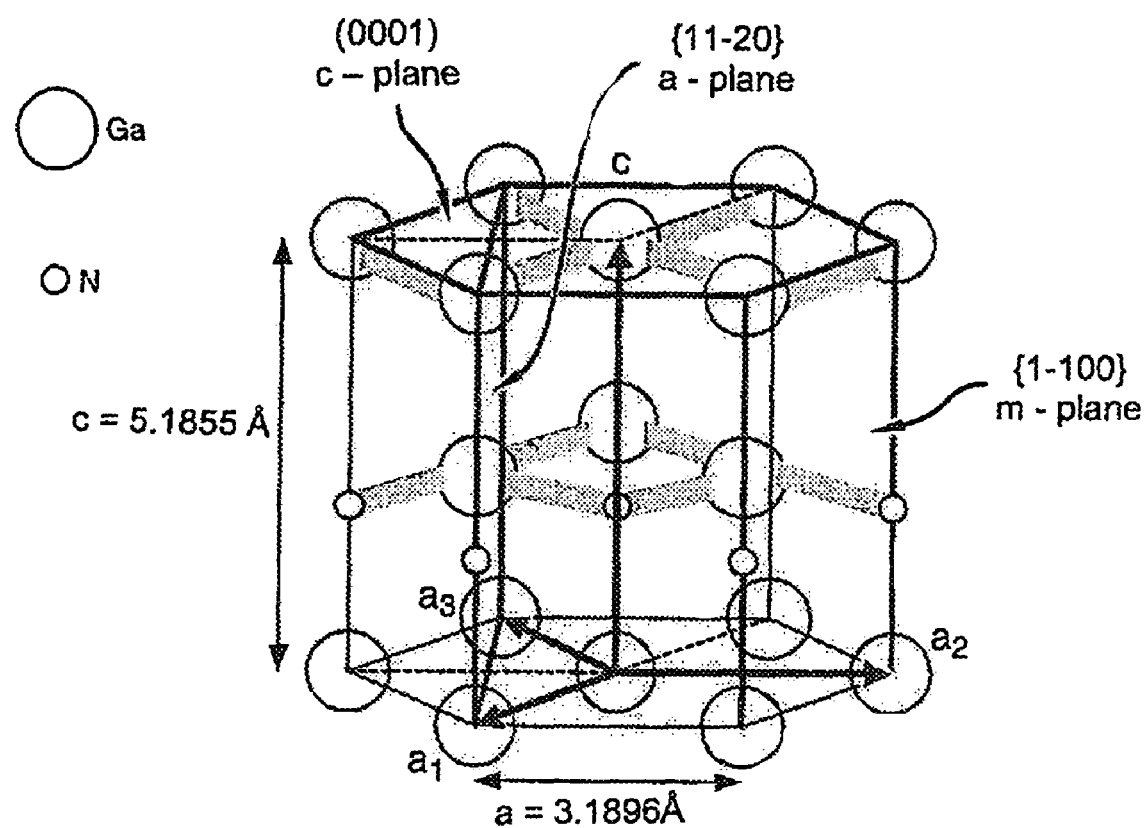

PROCESS FOR OBTAINING A HYBRID SUBSTRATE COMPRISING AT LEAST ONE LAYER OF A NITRIDED MATERIAL

This application is a 371 filing of International Patent Application PCT/EP2008/061488 filed Sep. 1, 2008.

BACKGROUND

The present invention relates to a process of obtaining a hybrid substrate, that is to say one consisting of several layers, comprising at least one layer of a nitrided material of III/N type.

Such a substrate is intended to be used in applications in the field of electronics, optics, photovoltaics or optoelectronics.

Nitrided materials of III/N type are materials in which nitrogen is combined with an element from column III of the Periodic Table, especially gallium nitride (GaN) and various nitrides or nitrided alloys based on indium (In), boron (B) and aluminum (Al).

These are promising materials for applications in high-power high-frequency electronic devices or for those subjected to high temperatures, such as a light-emitting diode (LED) emitting in the visible or the ultraviolet, or a blue/violet laser diode.

For information, it will be recalled below that the crystal structure of GaN has hexagonal symmetry, this being shown schematically in the appended FIG. 1.

It may be seen in this figure that gallium nitride has a hexagonal crystal structure defined by a crystal unit cell which is a prism, the base of which has edges of the same length a (3.1896 Å or 0.31896 nm) and oriented at 120° to each other. The height of the prism is denoted by c (5.1855 Å or 0.51855 nm). In hexagonal crystals, it is common practice to use a notation based on 4 indices (h, k, i, l) associated with the vectors $a_1$, $a_2$, $a_3$ and c for naming the crystallographic planes.

The most common gallium nitride (GaN) substrates have the crystallographic c-axis normal to their surface. Their growth is said to be along the c-axis or their growth plane is the c-plane. These substrates are called "standard GaN" substrates in the rest of the description and are termed polar.

Substrates made of standard GaN have the drawback of having undesirable spontaneous and piezoelectric polarization effects, as explained in the article "*Structural and morphological characteristics of planar* (11$\bar{2}$0) *a-plane gallium nitride grown by hydride vapor phase expitaxy*" Applied Physics Letters, Volume 83, Number 8, 25 Aug. 2003, pp 1554-1556 by B. A. Haskell et al.

They are therefore not always perfectly suitable for the production of electronic components for the aforementioned technological applications.

In addition, there is no industrial process for easily transferring a layer of III/N-type nitrided material onto a substrate.

The article "*Transfer of two-inch GaN film by the Smart-Cut™ technology*" Electronics Letters 26 May 2005, Vol. 41, No. 11 by A. Tauzin et al. describes the possibility of transferring a standard GaN film onto a support substrate by the Smart-Cut™ technology. This article studied the conditions for blistering in a GaN material. Blistering occurs only when the GaN is implanted with doses of hydrogen of at least $2\times10^{17}$ H$^+$/cm$^2$.

The articles "*Formation of nanovoids in high-dose hydrogen implanted GaN*", from Applied Physics Letters 89,031912 (2006) by I. Radu et al., "*Investigation of hydrogen implantation induced blistering in GaN*", Phys Stat. Sol. (c) 3, No. 6, 1754-1757, (2006) by R. Singh et al. and "*Blistering of H-implanted GaN*" Journal of Applied Physics, Volume 91, Number 6, 15 Mar. 2002, pp 3928-3930 by S. O. Kucheyev et al. also mention the appearance of blister-defects following the annealing of standard GaN implanted with hydrogen at doses equal to or greater than $2.6\times10^{17}$ H$^+$/cm$^2$.

The article "*Infrared and transmission electron microscopy studies of ion-implanted H in GaN*", Journal of Applied Physics, Volume 85, Number 5, 1 Mar. 1999, pp 2568-2573 by C. H. Seager et al. also shows the appearance of pyramidal cavities in standard GaN implanted with H$^+$ ions with doses between $2\times10^{16}$ H$^+$/cm$^2$ and $1\times10^{17}$ H$^+$/cm$^2$ followed by a thermal budget of one hour at around 890° C.

All the values mentioned show that the implantation doses for fracturing the GaN are at least five times higher than those needed to fracture silicon, and are therefore more difficult to apply in an industrial process. This is because, depending on the implantation current density used, the application of doses as high as these requires an implantation operation that may last up to several tens of hours.

Finally, the article "*Interaction between dislocations and He-implantation-induced voids in GaN epitaxial layers*", Applied Physics Letters 86, 211911 (2005) by D. Alquier et al. describes results of experiments in which He$^+$ helium ions are implanted into standard GaN.

It is mentioned in this article that an implantation of He$^+$ ions in GaN, with doses above $1\times10^{16}$ He$^+$/cm$^2$ followed by a heat treatment at around 1000-1100° C. for 2 minutes leads to the formation of cavities, some of which are of cylindrical shape and others of pyramidal shape.

However, this document in no way describes the implementation of an industrial layer transfer process.

One of the objects of the present invention is to provide a process for transferring a layer of a nitrided material of hexagonal crystal structure and of the III/N type, especially gallium nitride (GaN), which is easily industrialized, that is to say which uses implantation doses lower than those described in the literature, for example in the article "*Transfer of two-inch GaN film by the Smart-Cut™ technology*", Electronics Letters 26 May 2005 Vol. 41 No. 11 by A. Tauzin et al. in which the doses described range from $2\times10^{17}$ H$^+$/cm$^2$ to $5\times10^{17}$ H$^+$/cm$^2$.

Another object of the invention is to provide a layer of a nitrided material of hexagonal crystal structure, of III/N type and of good crystal quality, including after it has undergone ion implantation and layer transfer steps.

SUMMARY OF THE INVENTION

For this purpose, the invention relates to a process for obtaining a hybrid substrate comprising at least one "active" layer of a nitrided material of the III/N type intended for applications in the field of electronics, optics or optoelectronics.

In accordance with the invention, this process comprises the steps consisting in:

selecting a "source" substrate made of nitrided material of III/N type, having a hexagonal single crystal crystallographic structure;

carrying out an implantation of He$^+$ helium ions into this source substrate, through one of its faces, called the "implantation face", which lies in a plane parallel or approximately parallel with the "c" crystallographic axis of said nitrided material, at an implantation dose equal to or greater than $1\times10^{16}$ He$^+$/cm$^2$, for the purpose of forming inside said substrate, at a controlled average implantation depth, a number of nanocavities defining a weakened zone, the latter defining said active layer; and transferring said active layer by applying an overall energy budget which comprises a thermal budget called the "cavity growth thermal budget", capable of causing said nanocavities to be transformed into larger cavities, and a complementary energy budget called "detachment energy budget", capable of causing the active layer to be detached from the remainder of the source substrate.

Thanks to these features of the invention, it is possible to reduce the implantation time, and therefore the total duration of the process, and also to reduce the cost of the product obtained and the damage caused to the material through which the ions pass during the implantation.

According to other advantageous and non-limiting features of the invention, taken individually or in combination:
- the implantation into the source substrate (1) is carried out exclusively with $He^+$ helium ions;
- the implantation dose of $He^+$ helium ions is between $1\times10^{16}$ $He^+/cm^2$ and $1\times10^{17}$ $He^+/cm^2$;
- the transfer of said active layer of nitrided material comprises a molecular adhesion bonding step in which a stiffener is bonded to the implantation face of said source substrate;
- the cavity growth thermal budget is applied before said stiffener is bonded;
- the cavity growth thermal budget is applied after said stiffener is bonded;
- the transfer of said active layer of nitrided material comprises a step of depositing a layer of material on the implantation face of said source substrate;
- said deposition is a homoepitaxy or a heteroepitaxy;
- the epitaxy step provides all or part of the cavity growth thermal budget;
- the epitaxy step provides all or part of the detachment energy budget;
- the epitaxy step provides the overall energy budget for transferring said active layer;
- said cavity growth thermal budget comprises the application of a temperature of at least 800° C.;
- the complementary detachment energy budget is of mechanical origin;
- the implantation energy of the $He^+$ helium ions is between 30 and 250 keV;
- said source substrate is made of a material chosen from gallium nitride (GaN), aluminum nitride (AlN), indium nitride (InN), boron nitride (BN) and nitrided alloys of at least two materials taken from aluminum, gallium, boron and indium;
- said source substrate is made of bulk nitrided material of III/N type, having a hexagonal single crystal crystallographic structure, the growth plane of which is the c-plane, and in that the bulk material is cut so as to form the source substrate in such a way that one of the faces of the latter lies in a plane parallel or approximately parallel to the crystallographic c-axis of said bulk material;
- said source substrate is made of bulk nitrided material of III/N type, having a hexagonal single crystal crystallographic structure, the growth plane of which is an a-plane or an m-plane; and
- said source substrate is a composite substrate comprising a seed support material covered with a layer of single-crystal gallium nitride (GaN), the growth plane of which is an a-plane or an m-plane, in such a way that its free face is parallel or approximately parallel to its crystallographic c-axis.

The invention also relates to a hybrid substrate intended for applications in the field of electronics, optics or optoelectronics. In accordance with the invention it comprises an "active" layer of nitrided material of the III/N type, having a hexagonal single crystal crystallographic structure, the crystallographic c-axis of which lies in a direction parallel or approximately parallel to one of the faces, called "front" face, of this hybrid substrate, this active layer being bonded by molecular bonding to a stiffener, and this hybrid substrate is obtained by the aforementioned process

BRIEF DESCRIPTION OF THE DRAWINGS

Other features and advantages of the invention will become apparent from the description that now follows, with reference to the appended drawings that show, by way of indication but implying no limitation, several possible methods of implementation.

In these drawings:

FIG. 1 is a diagram showing the crystal structure of gallium nitride (GaN) of hexagonal symmetry.

DETAILED DESCRIPTION OF THE INVENTION

Figure 2A:
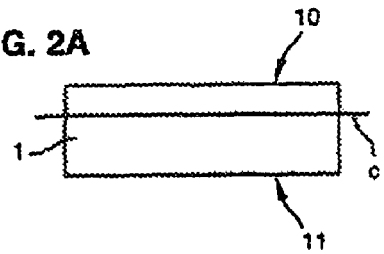
FIGS. 2A to 2E and 3A to 3E are diagrams illustrating the successive steps of two alternative methods of implementing the process according to the invention.
Figure 3A:
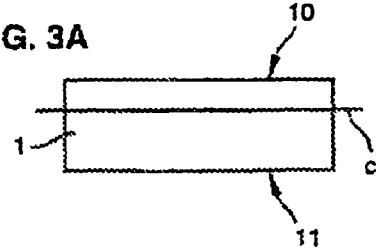

FIG. 2A shows a "source" substrate 1 made of a nitrided material of the III/N type, having a hexagonal single crystal crystallographic structure, the crystallographic c-axis of which lies in a direction parallel or approximately parallel to one of its faces 10.

Among the aforementioned materials are gallium nitride (GaN), aluminum nitride (AlN), boron nitride (BN), indium nitride (InN) and nitrided alloys of at least two materials taken from aluminum, gallium, boron and indium, such as ternary alloys, for example indium gallium nitride (InGaN), aluminum gallium nitride (AlGaN) and boron gallium nitride (BGaN), and such as quaternary alloys, for example aluminum indium gallium nitride (AlInGaN).

Preferably, this source substrate 1 is manufactured from bulk nitrided materials having an hexagonal single crystal crystallographic structure, the growth plane of which is either the c-plane, namely the (0001) plane, or an a-plane, for example the (11$\bar{2}$0) plane, or an m-plane, for example the (10$\bar{1}$0) plane. It should be noted that there are several a-planes and m-planes but only a single c-plane.

In the first case in which the growth plane of the bulk material is the c-plane, the material is cut in wafers along planes perpendicular or approximately perpendicular to this c-plane face, in such a way that the face 10 of said source substrate 1 obtained lies in a plane parallel or approximately parallel to the crystallographic c-axis of said bulk material.

In the second case in which the growth plane of the bulk material is an a-plane or an m-plane, it is not necessary to prepare it by cutting since the face 10 of said source substrate 1 intrinsically lies in a plane parallel or approximately parallel to the crystallographic c-axis of said bulk material.

The expression "approximately parallel" corresponds to an angular difference from this axis of ±5°.

The source substrate 1 of m-plane or a-plane may also come from epitaxy on a seed substrate, the surface of the material of which has the appropriate crystallographic plane well known to those skilled in the art (the reader may refer to the article "*Study on optimal growth of a-plane GaN grown on r-plane sapphire by metal-organic chemical vapor deposition*", Journal of Crystal Growth 300 (2007) 308-313 by T. S. Ko et al.).

The a-plane GaN may for example be obtained by epitaxy on a sapphire substrate, the surface of which has an r-plane, and the m-plane GaN from m-plane SiC or (100) $LiAlO_2$ substrates.

Figure 2B:
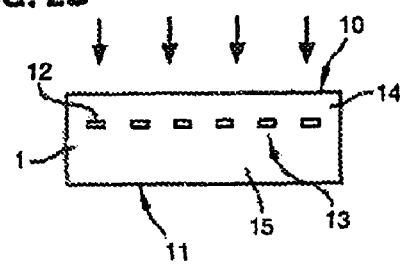
Figure 3B:
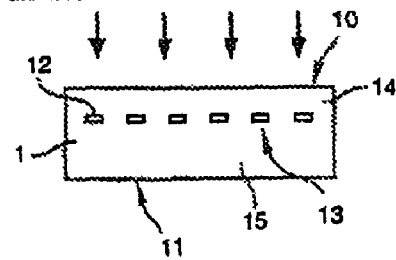

As may be seen in FIG. 2B, the source substrate 1 then undergoes an implantation of helium ions ($He^+$), this implantation being preferably carried out on its face 10, called hereafter in the rest of the description and the claims "implantation face".

Optionally, said implantation could be carried out via its opposite face 11.

In other words, this implantation is carried out perpendicularly or approximately perpendicularly to the "c" crystallographic axis of the source substrate 1.

The implantation dose is at least $1\times10^{16}$ $He^+/cm^2$. Preferably, it is also less than $4\times10^{17}$ $He^+/cm^2$. More preferably, it is between $1\times10^{16}$ $He^+/cm^2$ and $1\times10^{17}$ $He^+/cm^2$.

The implantation energy is between a few tens of keV and a few hundred keV, preferably between 30 and 250 keV, so as to obtain a weakened zone profile suitable for fracture and an implantation depth relative to the desired thickness of the layer to be transferred.

Preferably, the implantation is carried out exclusively with helium ions ($He^+$). Nevertheless, if necessary, one other or several other ionic specie(s) may be implanted in the source substrate 1. These co-implantation steps with helium ions may be simultaneous or successive.

This implantation has the effect of forming, within the source substrate 1 at a controlled average implantation depth, a number of nanocavities, that is to say cavities of nanoscale dimensions. These cavities are spherical or approximately spherical, with a diameter of about 1 to 2 nm. Together they define a weakened zone 13.

This weakened zone 13 is the boundary between, on the one hand, an active layer 14 that extends as far as the implantation face 10 and, on the other hand, a remainder 15 that extends as far as the face 11.

The implantation energy is adapted according to the depth at which the weakened zone 13 is intended to be defined, or more precisely according to the thickness that it is desired to give the active layer 14 in the final substrate obtained.

To give an example, an implantation energy of $He^+$ ions of 90 keV used in a gallium nitride (GaN) substrate makes it possible to define therein a weakened zone 13 lying at a depth of about 400 nanometers from its implantation face 10.

It should be noted that the aforementioned helium implantation doses are low compared with the doses of implanted $H^+$ ions commonly employed in the prior art for transferring a gallium nitride layer, this dose then being from 3 to $5\times10^{17}$ $H^+/cm^2$.

The process according to the invention therefore makes it possible for the implantation times to be considerably reduced, in proportion to the reduction in the dose used.

Next, the active layer 14 is transferred, which requires it to be detached from the remainder 15 of the source substrate 1.

This layer 14 is transferred by providing a sufficient energy budget to accomplish this detachment, hereafter called "overall energy budget".

This is made up of a thermal budget, called "cavity growth thermal budget", capable of causing said nanocavities 12 to be transformed into larger cavities 12', and into a complementary energy budget, called "detachment energy budget", capable of causing the active layer 14 to be detached from the remainder 15 of the source substrate 1.

Figure 2C:
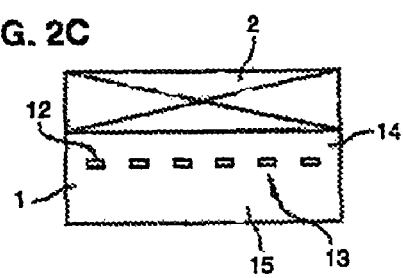
Figure 2D:
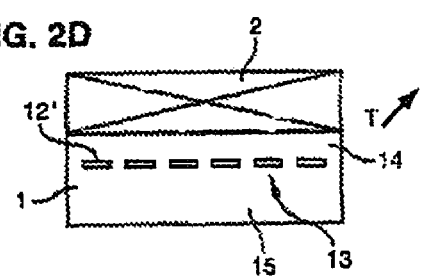

According to a first method of implementing the invention, illustrated in FIGS. 2C and 2D, this transfer is carried out by molecular adhesion bonding of a stiffener 2 onto the implantation face 10 of the source substrate 1, followed by the provision of at least one budget of thermal nature, sufficient to cause the nanocavities 12 to grow, that is to say to increase their dimensions.

For information, the expression "thermal budget" denotes a (duration of the heat treatment/temperature at which the treatment is carried out) pair.

Through the action of this thermal budget, the nanocavities 12 grow, so as to form cavities 12', for the most part of cylindrical shape, which lie parallel or approximately parallel to the c-axis of the source substrate 1. These cavities reach several tens of nanometers in length after being annealed for a few minutes at 1000-1100° C. for implantation with for example a dose of $1\times10^{17}$ $He^+/cm^2$ and an energy of 100 keV. This step is illustrated in FIG. 2D.

The stiffener 2 is preferably chosen from materials having a difference of coefficient of thermal expansion (CTE) that is low enough with respect to that of the active layer 14 to avoid excessively high stresses during the fracture heat treatment after bonding.

Moreover, the material of the stiffener may be chosen depending on the usage of the final structure 3 obtained. If the structure 3 is used for an epitaxy, the material of the stiffener will advantageously be chosen so as to have a CTE close to the material to be grown epitaxially.

When the difference in CTE between the material of the stiffener 2 and that of the active layer 14 is very high, as in the example of GaN and sapphire, the structure formed by bonding the two materials cannot withstand too high a heat treatment. In the example of GaN and sapphire, the composite structure can undergo a heat treatment of no more than 300° C. without causing its disassembly. It is therefore judicious to apply the "growth" thermal budget needed to form the cavities 12' before bonding the stiffener.

Next, the annealing to stabilize the bond contributes to the energy budget to be provided in order to fracture the GaN. It may be supplemented with the application of a mechanical stress.

The thermal budget applied to grow the nanocavities 12 is at least a few minutes at at least 800° C.

A person skilled in the art will adapt this budget according to the nature of the nitrided material and the implantation conditions (in particular the helium implantation dose).

To give an example, experiments carried out on gallium nitride (GaN) have demonstrated that the cavities 12' do not develop after a heat treatment of 3 hours 30 minutes at 660° C. but do start to appear after a heat treatment of 2 minutes at 1100° C. A person skilled in the art knows that applying a heat treatment at a lower temperature requires the treatment to be applied for a longer duration.

To give an example, gallium nitride shows the formation of cavities 12' after a heat treatment of 1 hour at 800° C.

After providing the cavity growth thermal budget, a complementary energy budget is applied for effecting the detachment, for example mechanical opening using a blade or the use of ultrasound.

Chemical etching treatment using a hot phosphoric acid ($H_3PO_4$) or potassium hydroxide (KOH) solution can also be applied for detaching the active layer 14.

However, this assumes that the faces of the substrate which must not be treated are protected.

Finally, the complementary energy budget may also be of thermal nature.

Figure 2E:
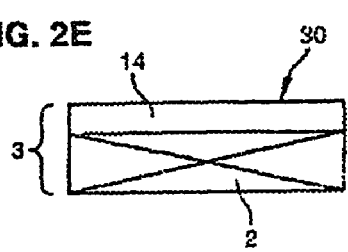

The hybrid substrate obtained after detachment from the remainder 15 is shown in FIG. 2E. It bears the reference 3 and comprises the stiffener 2 and the active layer 14 of nitrided material.

If the stiffener 2 is thin, that is to say around 5 μm, it serves merely to carry out what is called "delamination" transfer of the active layer 14. However, if the stiffener 2 is thicker, for example around 100 μm, then the hybrid substrate 3 obtained is thick enough to be self-supporting and to be used for example to carry out epitaxial regrowth.

A second method of implementation is illustrated with reference to FIGS. 3A to 3E. The elements that are identical to the first method of implementation bear the same numerical references.

This method differs from the first by the way in which the active layer 14 is transferred.

Figure 3C:
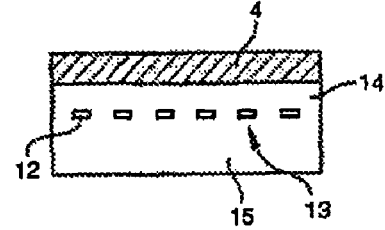
Figure 3D:
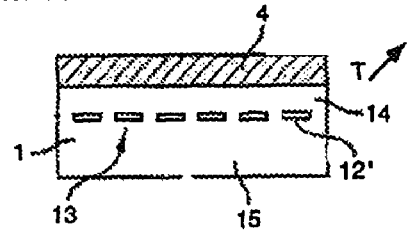

In this case, the transfer takes place by the deposition of a layer of material 4 on the implantation face 10 of said source substrate 1. The formation of this layer of material 4 is shown in FIG. 3C. It is continued until a certain thickness is reached, as shown in FIG. 3D, for example to allow a self-supporting structure to be finally obtained.

This deposition may be carried out by an epitaxy.

This epitaxy is preferably carried out on an epitaxy machine, using techniques well known to those skilled in the art, such as MOCVD (metal organic chemical vapour deposition), HVPE (hybrid vapour phase epitaxy), MBE (molecular beam epitaxy) and ELOG (epitaxial lateral over growth).

This epitaxy may be a homoepitaxy or heteroepitaxy, depending on the nature of the layer of material 4 and on that of the source substrate 1.

In the case of a heteroepitaxy, the material of the layer 4 will for example be chosen to have a lattice parameter matched to that of the active layer 14 so as to grow a crystalline structure having a low defect density. This material may also be chosen according to the difference between its coefficient of thermal expansion (CTE) and that of the active layer 14 so as to avoid the formation of cracks in one of the two layers upon cooling.

According to the first method of implementation, the epitaxy step is carried out at a suitable temperature and for a suitable time in order to provide the thermal budget sufficient to transform the nanocavities into larger cavities.

This thermal budget may also include an additional heat treatment if the thickness of the desired epilayer is reached before the structure has been provided with the budget needed to develop the cavities 12'.

The complementary detachment energy budget is then applied. This is of the same nature as that described in the first method of implementation (for example, the use of a blade, of ultrasound, or chemical etching, or heating).

According to the second method of implementation, the cavity growth thermal budget is applied before the epitaxy step.

The epitaxy step then provides an energy budget that contributes to detachment of the active layer 14. This energy budget may if necessary be supplemented. In other words, in this case, the epitaxy provides all or part of the detachment energy budget.

Finally, in the third method of implementation, the epitaxy is sufficient by itself to provide the entire overall energy budget needed to transfer the active layer 14.

Figure 3E:
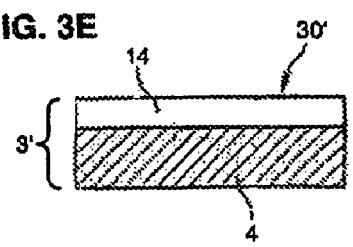

As shown in FIG. 3E, what is obtained after detachment is a hybrid substrate 3' comprising the active layer 14 transferred onto the epilayer 4.

Two illustrative examples of the invention will now be described in greater detail.

Example 1

A gallium nitride (GaN) substrate of hexagonal crystal structure was subjected to an implantation of helium ions with a dose of $6 \times 10^{16}$ He$^+$/cm$^2$ and an energy of 90 keV on its implantation face parallel to its crystallographic c-axis.

This implantation was used to define cavities forming a weakened zone at a depth of 400 nanometers from the implantation face.

This substrate was then subjected to a GaN epitaxy using the aforementioned HYPE technique until a thickness of a few hundred microns of GaN was obtained.

The growth process lasted 3 hours at a temperature of around 1000° C., after which the source substrate was fractured in the plane of the weakened zone. A hybrid substrate was thus obtained. In this case, the epitaxy provided both the cavity growth budget and the detachment budget.

Example 2

A gallium nitride (GaN) substrate of hexagonal crystal structure was subjected to an implantation of helium ions with a dose $6 \times 10^{16}$ He$^+$/cm$^2$ and an energy of 90 keV on its implantation face parallel to its crystallographic c-axis.

Next, a thermal budget at a temperature between 1000° C. and 1100° C. was applied for a time suitable for enabling the nanocavities 12 to grow into cavities 12', without forming blisters on the surface of the substrate 1, and without any delamination of the active layer 14.

Next, its unblistered, implanted plane face was brought into intimate contact with a stiffener 2 having a CTE very different from the GaN substrate, in this case sapphire.

The assembly then underwent an annealing operation so as to strengthen the bonding interface, this annealing being carried out at a temperature below the temperature at which the two substrates separate.

Mechanical stress using a blade caused the material to fracture in the weakened zone of the GaN.

A hybrid structure comprising a sapphire support covered with a GaN layer was thus obtained.

What is claimed is:

1. A process of obtaining a hybrid substrate comprising at least one active layer of Group III/N material intended for applications in the field of electronics, optics, photovoltaics or optoelectronics, which comprises:
    selecting a source substrate of Group III/N material having a hexagonal single crystal crystallographic structure with crystallographic axes of "a" and "c";
    carrying out an implantation of He$^+$ helium ions into the source substrate through an implantation face which lies in a plane that is parallel or approximately parallel with the "c" crystallographic axis of the material, at an implantation dose equal to or greater than $1 \times 10^{16}$ He$^+$/cm$^2$ to form a number of nanocavities defining a weakened zone inside the substrate at a controlled average implantation depth, with the weakened zone defining the active layer; and
    transferring the active layer from the source substrate by applying an overall energy budget which comprises a cavity growth thermal budget for causing the nanocavities to be transformed into larger cavities, and a complementary detachment energy budget for detaching the active layer from the source substrate.

2. The process according to claim 1, wherein the implantation into the source substrate is carried out exclusively with He$^+$ helium ions.

3. The process according to claim 1, wherein the implantation dose of He$^+$ helium ions is between $1 \times 10^{16}$ He$^+$/cm$^2$ and $1 \times 10^{17}$ He$^+$/cm$^2$.

4. The process according to claim 1, which further comprises bonding a stiffener to the implantation face of the source substrate by molecular adhesion after the implantation of the He⁺ helium ions so that the active layer can be transferred to the stiffener.

5. The process according to claim 1, wherein the active layer is deposited on the implantation face of the source substrate prior to being transferred.

6. The process according to claim 1, wherein the active layer is deposited by epitaxy on the implantation face of the source substrate prior to being transferred, with the epitaxy providing all or part of the cavity growth thermal budget.

7. The process according to claim 1, wherein the active layer is deposited by epitaxy on the implantation face of the source substrate prior to being transferred, with the epitaxy providing all or part of the detachment energy budget.

8. The process according to claim 1, wherein the active layer is deposited by epitaxy on the implantation face of the source substrate prior to being transferred, with the epitaxy providing the overall energy budget for transferring the active layer.

9. The process according to claim 1, wherein the cavity growth thermal budget comprises application of a temperature of at least 800° C.

10. The process according to claim 1, wherein the complementary detachment energy budget comprises a mechanical force.

11. The process according to claim 1, wherein the implantation energy of the He⁺ helium ions is between 30 and 250 keV.

12. The process according to claim 1, wherein the source substrate is made of gallium nitride (GaN), aluminum nitride (AlN), indium nitride (InN), boron nitride (BN), or a nitrided alloy of at least two materials taken from aluminum, gallium, boron and indium.

13. The process according to claim 1, wherein the source substrate is made of bulk Group III/N material having a growth plane which is the c-plane, with a face of the substrate lying in a plane that is parallel or approximately parallel to the crystallographic "c" axis of the bulk material.

14. The process according to claim 1, wherein the source substrate is made of bulk Group III/N material having a growth plane which is an a-plane or m-plane.

15. The process according to claim 1, wherein the source substrate (1) is a composite substrate comprising a seed support material covered with a layer of single-crystal gallium nitride (GaN) having a growth plane which is an a-plane or an m-plane, in such a way that its free face is parallel or approximately parallel to its crystallographic "c" axis.

16. The process according to claim 4, wherein the cavity growth thermal budget is applied before the stiffener is bonded.

17. The process according to claim 4, wherein the cavity growth thermal budget is applied after the stiffener is bonded.

18. The process according to claim 5, wherein the active layer is deposited by homoepitaxy.

19. The process according to claim 5, wherein the active layer is deposited by heteroepitaxy.

* * * * *

UNITED STATES PATENT AND TRADEMARK OFFICE
CERTIFICATE OF CORRECTION

| | | |
|---|---|---|
| PATENT NO. | : 8,093,686 B2 | Page 1 of 1 |
| APPLICATION NO. | : 12/672819 | |
| DATED | : January 10, 2012 | |
| INVENTOR(S) | : Garnier | |

It is certified that error appears in the above-identified patent and that said Letters Patent is hereby corrected as shown below:

Title Page:
Item (56) References Cited, on Page 2, under Other Publications:
  Haskett, B.A. et al. reference: change "A-Plane" to -- α-Plane --;
  Ko, T.S. et al. reference: after "Growth" insert -- Conditions --; and
  Tauzin, A. et al. reference: before "(2005)" insert -- Proceedings, Electrochemical Society, vol. 2, pp. 119-127 --.

In The Claims:
Column 10:
Line 2 (claim 12, line 2), change "aluminum" to -- aluminium --.
Line 4 (claim 12, line 4), change "aluminum" to -- aluminium --.

Signed and Sealed this
Twenty-first Day of February, 2012

David J. Kappos
*Director of the United States Patent and Trademark Office*